United States Patent [19]
Lee

[11] Patent Number: 5,397,856
[45] Date of Patent: Mar. 14, 1995

[54] SUBSTRATE FIXING APPARATUS
[75] Inventor: Man Y. Lee, Suwon, Rep. of Korea
[73] Assignee: Samsung Electronics Co., Ltd., Suwon, Rep. of Korea
[21] Appl. No.: 29,454
[22] Filed: Mar. 11, 1993
[30] Foreign Application Priority Data
Nov. 4, 1992 [KR] Rep. of Korea ............. 92-21539 U
[51] Int. Cl.⁶ .......................................... H02G 3/08
[52] U.S. Cl. .................... 174/52.1; 257/726; 361/725
[58] Field of Search ............. 174/52.1, 51, 35 R; 361/752, 753, 759, 816, 818, 724, 725; 257/726

[56] References Cited
U.S. PATENT DOCUMENTS 4,525,770  6/1985  Perretta ........................ 361/752
4,903,167  2/1990  Lichtensperger ............... 361/752
5,235,492  8/1993  Humbert ........................ 174/51

Primary Examiner—Leo P. Picard
Assistant Examiner—Christopher Horgan
Attorney, Agent, or Firm—Ladas & Parry

[57] ABSTRACT

A substrate fixing apparatus in which a substrate such as a printed circuit board can be simply fixed in a main body of the product without separate fixture members. The apparatus comprises a chassis formed of a supporting jaw for supporting a substrate inwardly projected and first and second insertion holes vertically at an upper side of the supporting jaw, and at least one substrate holder fitted to the top end of the side surface of the chassis and the first and second insertion holes and having first and second resilient pieces for resiliently fixing the substrate, the resilient pieces being integrally formed with each other. Thus, the yield of the product can be improved by an automatized productive facilities with the cost of fabricating the product being reduced considerably.

14 Claims, 3 Drawing Sheets

SUBSTRATE FIXING APPARATUS

BACKGROUND OF THE INVENTION

1. Field of the Invention

The present invention relates to a substrate fixing apparatus in which a substrate such as a printed circuit board can be simply fixed in a main body of the product without separate fixture members.

2. Description of the Related Art

In general, a substrate such as a printed circuit board having various parts or a circuit pattern is mounted on the main body of an electric or electronic product or data communication system in order to achieve a given function.

FIGS. 1 and 2 show examples of a substrate fixing apparatus generally employed in the art. More specifically, in a conventional substrate fixing apparatus as shown in FIGS. 1A and 1B, a fixing groove 10b is formed by a bent portion 10a formed at both sides of a chassis 10 which is disposed in the main body of the product (only one side is seen in the drawing). A substrate supporting piece 11 formed with a guide groove 11a on one side, is fitted in the fixing groove 10b. At this time, an aperture 10c formed on the chassis 10 is aligned with a screw hole 11b formed on of the substrate supporting piece 11. A fixing screw 12 fastens the chassis 10 and the supporting piece 11. Then, a substrate 13 is inserted into the guide groove 11a of the supporting piece 11.

According to an another fixing apparatus as shown in FIGS. 2A and 2B, a plurality of substrate supporting pieces 20c, each having a screw hole 20b, are formed on a top portion 20a by cutting and bending both sides of a chassis 20 (only one side is seen in the drawings). The screw hole 20b of the supporting piece 20c coincides with a hole 21a formed on the substrate 21, and a fixing screw 22 fastens the chassis 20 and the substrate 21.

However, in the conventional substrate fixing apparatus as described above, since the holes are first provided on the chassis and the substrate and then are fastened by the fixing screws, it requires accurate operations to fasten the substrate and the chassis and a separate driver or electromotive tool is needed to fasten the chassis and the substrate. Further, the screw threads of the screw are likely to be defaced in disassembling or assembling the substrate on the chassis. As a result, the screw often turns freely in the holes.

For this reason, a technique in which the assembling procedure is simplified and costs are reduced is presently known. But it is also complicated in construction and it is difficult to disassemble the substrate fastened to the chassis.

Another substrate supporting technique is disclosed in Japanese utility model laid-open publication No. sho 63-164287, in which a substrate is placed on a base and an upper surface of the substrate is then fixed by virtue of a separate fixing member without using a fixing screw.

The technique disclosed in the publication is disadvantageous as it requires the assembling procedure executed between the substrate and the chassis, and an additional process step to adhere the fixing member.

SUMMARY OF THE INVENTION

An object of the present invention is to provide a substrate fixing apparatus in which a substrate can be resiliently supported in a main body of an electric or electronic product by virtue of a substrate holder insertly arranged on the top end of both sides of a chassis, thereby improving output of the product through automatized productive facilities reducing the cost of the product considerably.

In order to achieve the above object, the substrate fixing apparatus for fixing a substrate having various circuit patterns on a chassis arranged in a main body of an electric or electronic product, comprises: a chassis formed as a supporting jaw for receiving and supporting a substrate and first and second insertion holes vertically aligned at an upper side of said supporting jaw; and at least one substrate holder fitted at the top end of the side surface of said chassis and said first and second insertion holes and having first and second resilient pieces for resiliently fixing said substrate, the resilient pieces being integrally formed each other.

The above and other objects and advantages of the invention will be understood from the following description taken in conjunction with the accompanying drawings.

DETAILED DESCRIPTION OF THE INVENTION

Figure 1A:
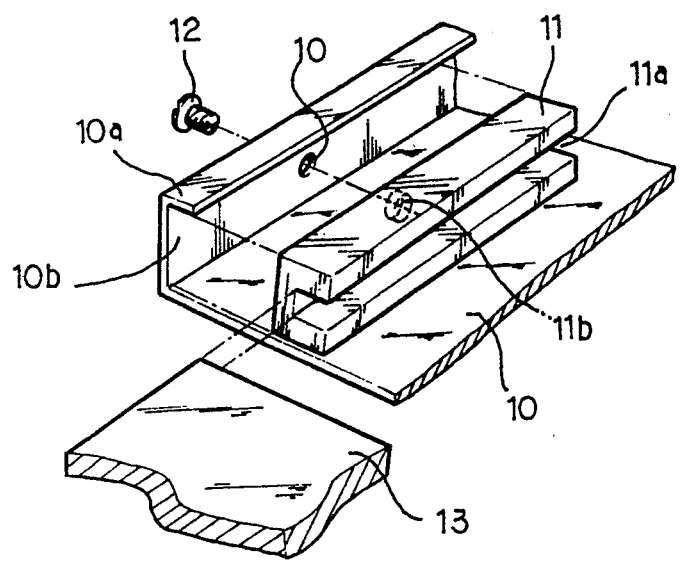
FIGS. 1A and 1B, and FIGS. 2A and 2B are exploded perspective and cross-sectional views showing a conventional substrate fixing apparatus.
Figure 1B:
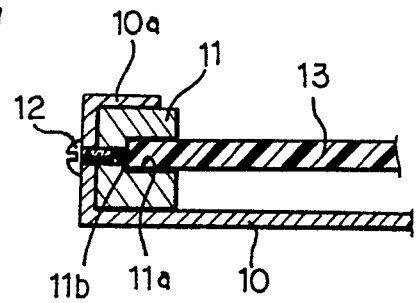
Figure 2A:
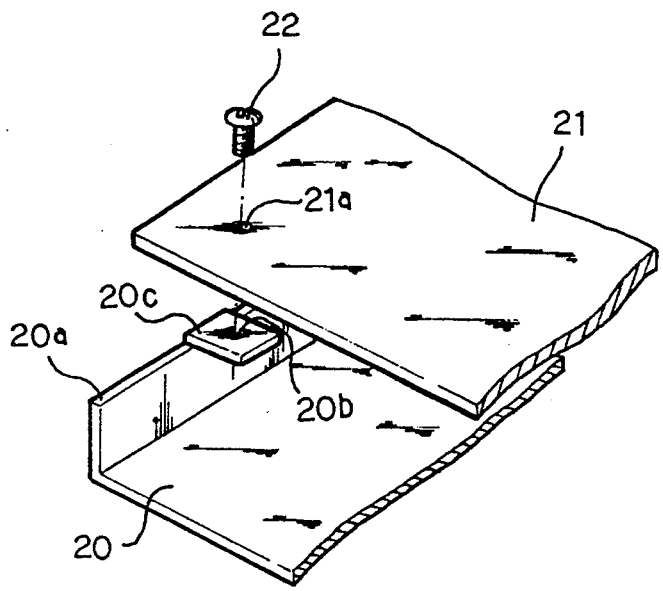
Figure 2B:
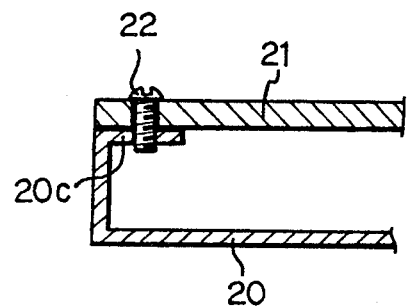
Figure 3A:
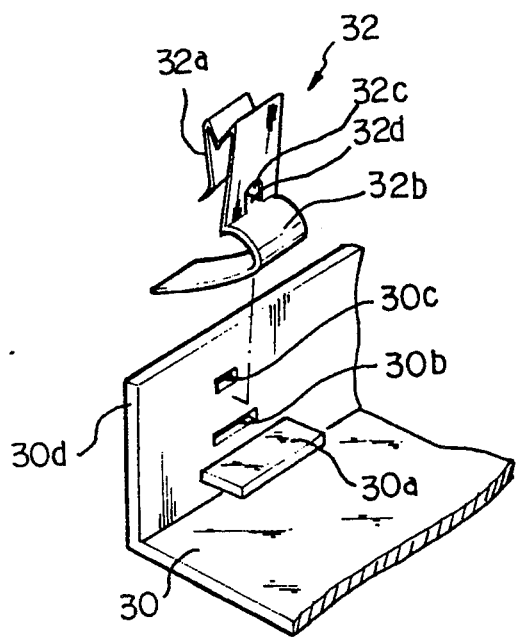
FIGS. 3A and 3B are exploded perspective and cross-sectional views showing a substrate fixing apparatus according to an example of the present invention.
Figure 3B:
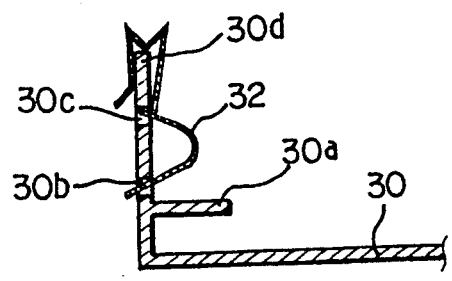

Referring to FIGS. 3A and 3B which show exploded view and assembled cross-sectional views of a substrate fixing apparatus according to an example of the present invention, a supporting jaw 30a projects from an inside surface of an upstanding wall a chassis 30, the upstanding being cut at both sides, (only one side is seen in the drawings). The ends are cut and bent predetermined intervals from a base of the chassis to form the upstanding walls. First and second insertion holes 30b and 30c having different lengths are vertically formed in the upstanding wall vertically above the upper surface of the supporting jaw 30a.

A substrate holder 32 is fitted on the top edge 30d of the chassis 30 and engages the first and second holes 30b and 30c so as to suitably fix the substrate 31 on the chassis 30.

The substrate holder 32, includes a first resilient piece 32a of a "⊏" shape integrated with a second resilient piece 32b of an arcuate shape. A projection 32d defined by a cut out 32c is formed at the center of the first and second resilient pieces 32a and 32b. The projection 32d is formed at the junction of pieces 32a and 32b where a bend is provided. The projection 32d extends rearwardly while the arcuate portion of piece 32b curves forwardly.

Figure 4:
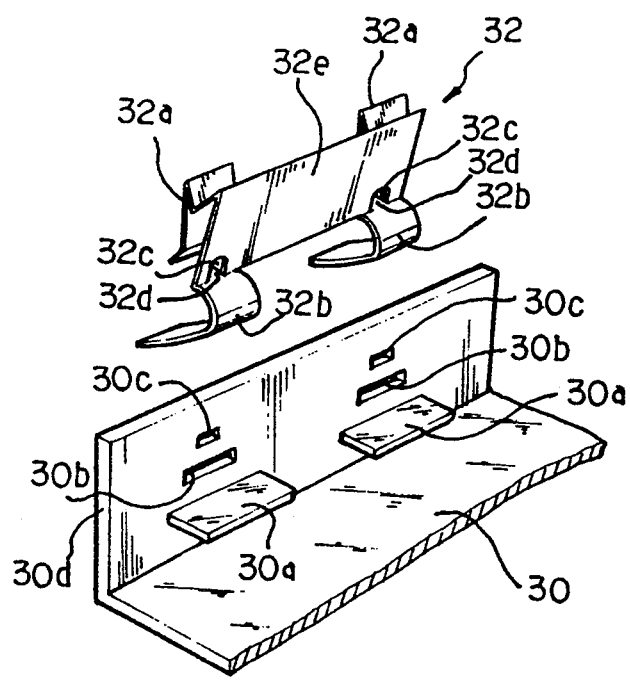
FIG. 4 is a perspective view showing a substrate fixing apparatus according to another example of the present invention.

FIG. 4 is a view showing another example of the substrate fixing apparatus of the present invention, in which the same reference numerals denote the same parts or components as in FIG. 3. In the drawing, a pair of substrate holders 32 are integrated by a connecting plate 32e. Two supporting jaws 30a are formed on the chassis 30 at a spacing corresponding to that of the pair of substrate holders 32, and the first and second insertion holes 30b and 30c are provided above each jaw 30a.

Accordingly, a predetermined number of substrate holders 32 are fitted on the top edge 30d of sidewalls of the chassis 30, and then the substrate 31 can be substantially secured to the substrate by the resilience of the substrate holders 32.

Figure 5A:
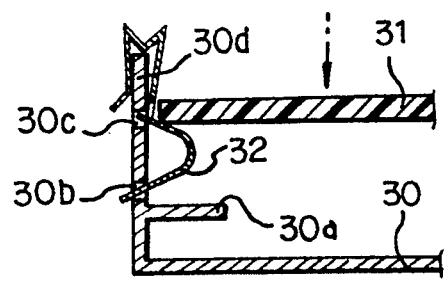
FIGS. 5A to 5C are assembled cross-sectional views illustrating the operation of the substrate fixing apparatus in FIGS. 3A and 3B.
Figure 5B:
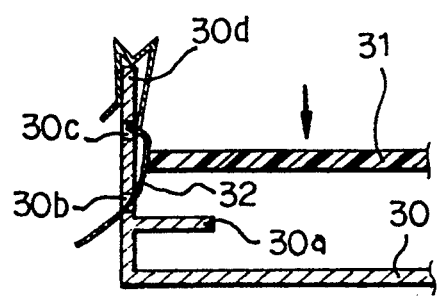
Figure 5C:
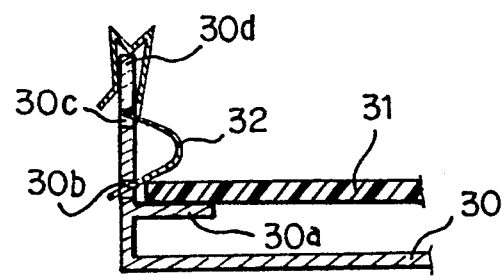

FIGS. 5A to 5C show the operating states of the substrate fixing apparatus. More particularly, the second resilient piece 32b of the substrate holder 32 is first inserted into the first insertion hole 30b formed on the chassis 30, while the first resilient piece 32a is fixed on the top edge 30d of the chassis 30 such that one leg of resilient piece 32a faces the rear surface of the upstanding wall of the chassis while the second leg of resilient piece 32a faces the front surface of the upstanding wall. Accordingly, the projection 32d formed at the center of the substrate holder 32 is resiliently secured in the second insertion hole 30b so that the substrate holder 32 is securely mounted on the chassis 30.

In this case, it should be noted that a desired number of the substrate holders 32 may be supported on the top edge 30d of the sidewall of the chassis 30 depending on the conditions for fitting the substrate 31 on the chassis.

As shown in FIG. 5A, when the substrate 31 is placed above the second resilient piece 32b of the substrate holder 32 and then pressed downwardly, the second resilient piece 32b is deformed backwardly and at the same time the substrate 31 becomes suitably supported on the supporting jaw 30a, as shown in the FIG. 5B. The second resilient piece 32b returns to its original position so as to suitably support the substrate 31 from above, as shown in FIG. 5C.

The substrate 31 can be separated from the chassis 30 by pressing the second resilient piece 32b of the substrate holder 32 backwards.

Meanwhile, when two or more of the substrate holders 32 are integrated through the connecting plate 32e, the same operation and effect as in FIGS. 5A to 5C is obtained. The resilient force in this case is greatly increased as compared with the single substrate holder 32. Accordingly, the number of substrate holders 32 can be appropriately selected depending upon the desired substrate fixing condition.

Furthermore, the substrate 31 can be plated with copper in an area where the chassis 30 is to be contacted by the substrate holder 32 so as to provide a natural grounding effect therebetween.

While the description has been made with reference to the substrate holder 32 disposed at any one side of the chassis 30, it can be understood that several substrate holders 32 may be provided on both sides of the chassis 30 in accordance with the size and pattern of the substrate 31, and certain changes and modifications of the holder can be made without departing from the scope of the invention.

As mentioned above, according to the present invention, since the substrate can be resiliently mounted on the main body of the electric or electronic product by virtue of at least one substrate holder secured to the top edge of both sidewalls of the chassis without separate fastening members, production yield of the product can be improved by an automation and the cost of fabricating the product can be reduced considerably.

What is claimed is:

1. A substrate fixing apparatus comprising a chassis, a substrate and holder means for attaching the substrate to the chassis, said chassis having an upstanding wall and a jaw projecting from said upstanding wall on which an edge portion of said substrate can rest, said upstanding wall having two holes located above said jaw one hole vertically above the other, said holder means comprising a holder including a first resilient portion of C-shape for mounting on and over an upper edge of said upstanding wall of said chassis, said first portion of the holder including a first leg facing a rear surface of said upstanding wall and a second leg facing a front surface of said upstanding wall, said holder further including a second resilient portion of arcuate shape extending from said second leg, said second portion of arcuate shape being curved away from said front surface of said upstanding wall and having a free end slidably engaged in the lower one of said holes located closest to said jaw, said second leg and said second resilient portion being connected together at a junction at which a projection is formed extending in the upper one of the holes in said upstanding wall so that when the edge portion of the substrate is lowered onto said jaw, said edge portion first deforms said arcuate portion of the holder to travel there past whereafter said arcuate portion returns to an original position to support the edge portion of the substrate from above.

2. The apparatus as claimed in claim 1, wherein said first and second resilient portions of said holder are integrally joined together.

3. The apparatus as claimed in claim 1, wherein said junction between said first and second portions of the holder comprises a bend, said holder being provided with a cut-out at said bend, said projection being bent outwardly from said cut-out.

4. The apparatus as claimed in claim 3, wherein said projection is narrower than said first and second portions, said upper hole in the upstanding wall being narrower than the lower hole in the upstanding wall.

5. The apparatus as claimed in claim 1, wherein said holder means further comprises a second said holder integrally connected to the first said holder in laterally spaced relation therewith, said upstanding wall having two further said holes and a further said jaw for cooperatingly engaging said second holder and said substrate.

6. The apparatus as claimed in claim 5, wherein said first and second holders are integrally connected by a flat connecting plate.

7. The apparatus as claimed in claim 1, comprising a copper plating on said upstanding wall in a region thereof contacted by said holder to provide a grounding effect.

8. Holder means for attaching a substrate to an upstanding wall of a chassis provided with a jaw on which an edge portion of the substrate can rest, and two holes located vertically above one another above said jaw, said holder means comprising a resilient holder including first and second integrally connected portions, said first portion being of C-shape for mounting on and over an upper edge of an upstanding wall of the chassis, said first portion including a first leg for facing a rear surface of the upstanding wall and a second leg for facing a front surface of the upstanding wall, said second portion extending from said second leg and being of arcuate shape curved away from said first surface of said upstanding wall and having a free end for slidably engaging in the lower of the holes in the upstanding wall, said second leg and said second portion being connected together at a junction at which a projection is formed, said projection and said second portion of arcuate shape projecting in opposite directions relative to a plane passing through said second leg.

9. Holder means as claimed in claim 8, wherein said junction between said first and second portions of the holder comprises a bend, said holder being provided with a cut-out at said bend, said projection being bent outwardly from said cut-out.

10. Holder means as claimed in claim 8 wherein said projection is narrower than said first and second portions.

11. Holder means as claimed in claim 8, further comprising a second said holder integrally connected to the first said holder in spaced relation therewith.

12. Holder means as claimed in claim 11, wherein said first and second holders are integrally connected by a flat connecting plate.

13. The apparatus as claimed in claim 1, wherein said second resilient portion of arcuate shape of said holder is resiliently deformable when said portion of C-shape is mounted on and over the upper edge of the upstanding wall of the chassis, said free end of the holder is slidably engaged in the lower one of said holes and said projection is in the upper one of said holes.

14. Holder means as claimed in claim 8, wherein said second portion of arcuate shape is resiliently deformable when said portion of C-shape is mounted on and over the upper edge of the upstanding wall of the chassis, said free end of the second portion is slidably engaged in the lower one of the holes and said projection is in the upper one of said holed.

* * * * *